United States Patent
Chung

(10) Patent No.: US 6,611,134 B2
(45) Date of Patent: Aug. 26, 2003

(54) OPEN TYPE ELECTRICITY METER

(75) Inventor: Beom-Jin Chung, Seoul (KR)

(73) Assignee: Xeline Co., Ltd., Seoul (KR)

( * ) Notice: Subject to any disclaimer, the term of this patent is extended or adjusted under 35 U.S.C. 154(b) by 93 days.

(21) Appl. No.: 09/906,072

(22) Filed: Jul. 17, 2001

(65) Prior Publication Data

US 2002/0014884 A1 Feb. 7, 2002

(30) Foreign Application Priority Data

Aug. 2, 2000 (KR) .......................................... 2000-44855

(51) Int. Cl.[7] .............................................. G01R 11/32
(52) U.S. Cl. .......................... 324/74; 324/435; 324/458
(58) Field of Search .......................... 324/74, 435, 458, 324/137, 99 D, 103 P, 122; 359/145, 110, 155, 148; 340/870.02, 3.7, 5.9; 702/62; 235/492, 381; 713/200

(56) References Cited

U.S. PATENT DOCUMENTS 5,668,538 A * 9/1997 Warwick .................... 340/870
5,742,512 A * 4/1998 Edge et al. ................. 364/480

FOREIGN PATENT DOCUMENTS

| GB | 2 325 598 A | 11/1998 |
| WO | WO 97/13186 A | 4/1997 |
| WO | WO 01/54297 A1 | 7/2001 |

* cited by examiner

Primary Examiner—Kamand Cuneo
Assistant Examiner—Trung Q. Nguyen
(74) Attorney, Agent, or Firm—Morgan, Lewis & Bockius LLP

(57) ABSTRACT

Disclosed an open type electricity meter having an open type communication module. The module comprises a power line communication unit for separating a high frequency power line communication signal from a power line signal; a packet connecting unit for transmitting the communication signal received into the power line communication unit according to frame type to a corresponding processing unit as data, and packets data from a higher processing unit according to frame type to provide the same to the power line communication unit; a low speed data processing unit being connected to the packet connecting unit and installing a TCP/IP protocol engine to perform a remote measurement communication; a high speed data processing unit for performing a communication with the power line communication unit to transmit high speed data to an indoor communication terminal and to transmit the high speed data to an outdoor communication terminal through the packet connecting unit; and a telephony processing unit connected to an external audio processing unit for coding an audio signal from the audio processing unit to be provided to the packet connecting unit and decoding the coded audio signal from the packet connecting unit to be provided to the external audio processing unit. A low voltage distribution network can be applied as communication and subscriber networks to enhance the efficiency of the data communication.

7 Claims, 5 Drawing Sheets

FIG.5a

| OSI 7 Layer | MULTIPLE FUNCTIONAL OPEN TYPE ELECTRICITY METER | | |
|---|---|---|---|
| | LOW SPEED DATA PROCESSING UNIT | HIGH SPEED DATA PROCESSING UNIT | TELEPHONY PROCESSING UNIT |
| Application | APPLICATION REMOTE MEASURING | | APPLICATION |
| Presentation | | | |
| Session | | | TELEPHONY PROTOCOL ENGINE |
| Transport | TCP | | |
| Network | IP | | |
| Data Link | CSMA/CD(IEEE 802.3) | | |
| Physical | PLC PHY | | |

FIG.5b

| OSI 7 Layer | MULTIPLE FUNCTIONAL OPEN TYPE ELECTRICITY METER | | |
|---|---|---|---|
| | LOW SPEED DATA PROCESSING UNIT | HIGH SPEED DATA PROCESSING UNIT | TELEPHONY PROCESSING UNIT |
| Application | APPLICATION REMOTE MEASURING | | APPLICATION |
| Presentation | | | |
| Session | | | TELEPHONY PROTOCOL ENGINE |
| Transport | TCP | | |
| Network | IP | | |
| Data Link | CSMA/CD(IEEE 802.3) | | |
| Physical | PLC PHY(1) | | PLC PHY(2) |

OPEN TYPE ELECTRICITY METER

BACKGROUND OF THE INVENTION

1. Field of the Invention

The invention relates to an electricity meter, and in particular, to an open type electricity meter which has a TCP/IP communication protocol engine so that a remote measuring together with a high speed data communication and a telephony service can be carried out through a power line.

2. Description of the Related Art

In general, an electricity meter is an analog or electronic apparatus for measuring a consumed power quantity to display the measured quantity in an additional display unit. As a more developed form, the electricity meter provides a remote measuring function so that a measuring personnel can measure the power quantity data at a remote or an adjacent location without directly visiting every house where the electricity meter is installed. In this case, the power quantity data are sent from the electricity meter through a telephone line, a high frequency module or a power line communication module. Therefore, the electricity meters of the related art are aimed only for the remote measuring thereby restricting uses thereof. Also, they do not have an open type communication structure so that there are disadvantages that expandibility and accessibility according to communication are low and bidirectional communication is difficult.

SUMMARY OF THE INVENTION

Therefore the invention is proposed to solve the foregoing problems, and it is an object of the invention to provide an open type electricity meter in which a TCP/IP communication protocol engine and a exclusive protocol engine are provided so that a remote measuring, a telephony service and a low/high speed data communication can be carried out through a power line communication.

To solve the foregoing object of the invention, it is provided an open type comprising: a power line communication unit for separating a high frequency power line communication signal from a power line signal; a packet connecting unit for transmitting the communication signal received into the power line communication unit according to frame type to a corresponding processing unit as data, and packets data from a higher processing unit according to frame type to provide the same to the power line communication unit; a low speed data processing unit being connected to the packet connecting unit and installing a TCP/IP protocol engine to perform a remote measurement communication; a high speed data processing unit for performing a communication with the power line communication unit to transmit high speed data to an indoor communication terminal and to transmit the high speed data to an outdoor communication terminal through the packet connecting unit; and a telephony processing unit connected to an external audio processing unit for coding an audio signal from the audio processing unit to be provided to the packet connecting unit and decoding the coded audio signal from the packet connecting unit to be provided to the external audio processing unit.

BRIEF DESCRIPTION OF THE DRAWINGS

Hereinafter a preferred embodiment of the invention will be described in detail in reference to the appended drawings, wherein:

FIG. 5A and FIG. 5B are communication protocol formats applied to the open type electricity meter according to the invention.

DETAILED DESCRIPTION OF THE PREFERRED EMBODIMENT

Figure 1:
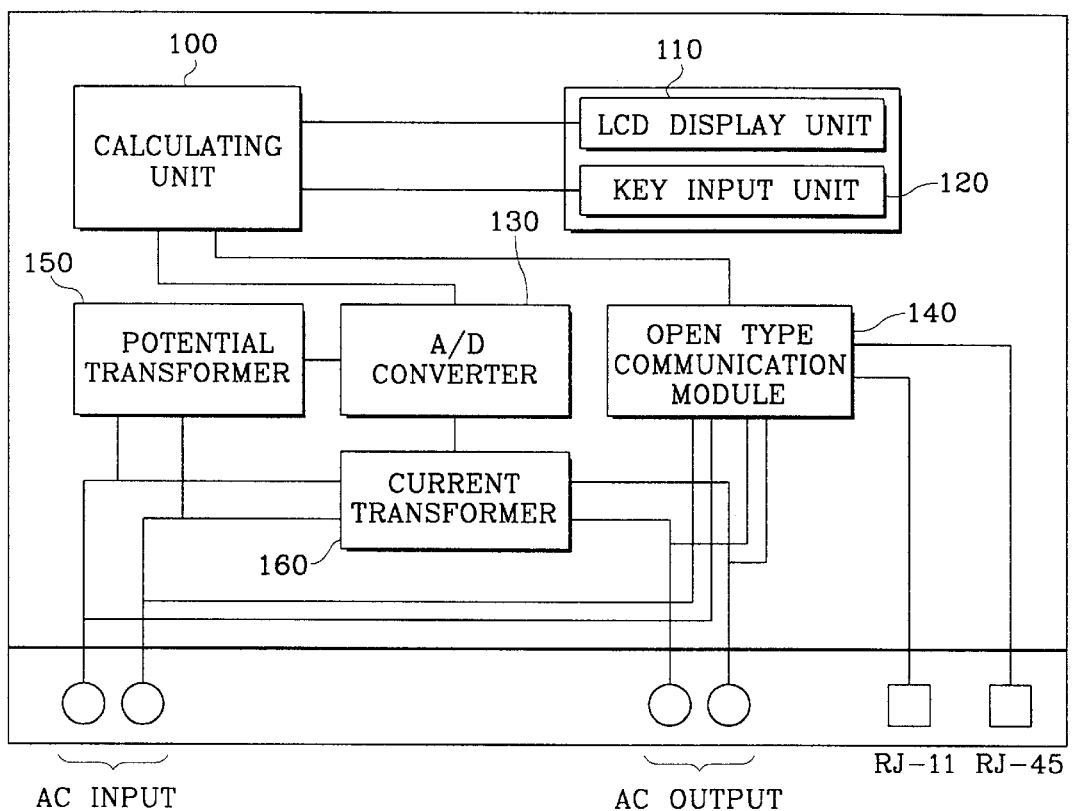
FIG. 1 schematically shows the structure of an open type electricity meter according to the invention.

FIG. 1 schematically shows the structure of an open type electricity meter according to the invention.

Referring to FIG. 1, the open type electricity meter is comprised of a calculating unit 100, an LCD display unit 110, a key input unit 120, an A/D converter 130, an open type communication module 140, a potential transformer 150 and a current transformer 160.

The current transformer 160 converts an externally applied electric power into a current quantity and provides the converted current quantity into the A/D converter 130. The potential transformer 150 converts the externally applied electric power into a low voltage and provide the converted low voltage to the A/D converter 130. The A/D converter 130 converts the received voltage and current into a digital signal and provides the digital signal to the calculating unit 100. The calculating unit 100 calculates the digital signal from the A/D converter 130 to measure a consumed power quantity. The LCD display unit 110 displays the consumed power quantity calculated from the electricity calculating unit 100 in the form of number and graph.

The open type communication module 140 is connected to an outdoor AC input and output sides to perform a power line communication, counts electric power quantity calculated from the calculating unit 100 to perform a remote measuring, and performs audio and high speed data communications through an external interface. The calculating unit 100 is requested to measure the electric power from the open type communication module 140, and calculates and measures the power quantity from a digital signal received from the A/D converter 130 to provide the measured power quantity to the remote measuring unit of the open type communication module 140.

Figure 2:
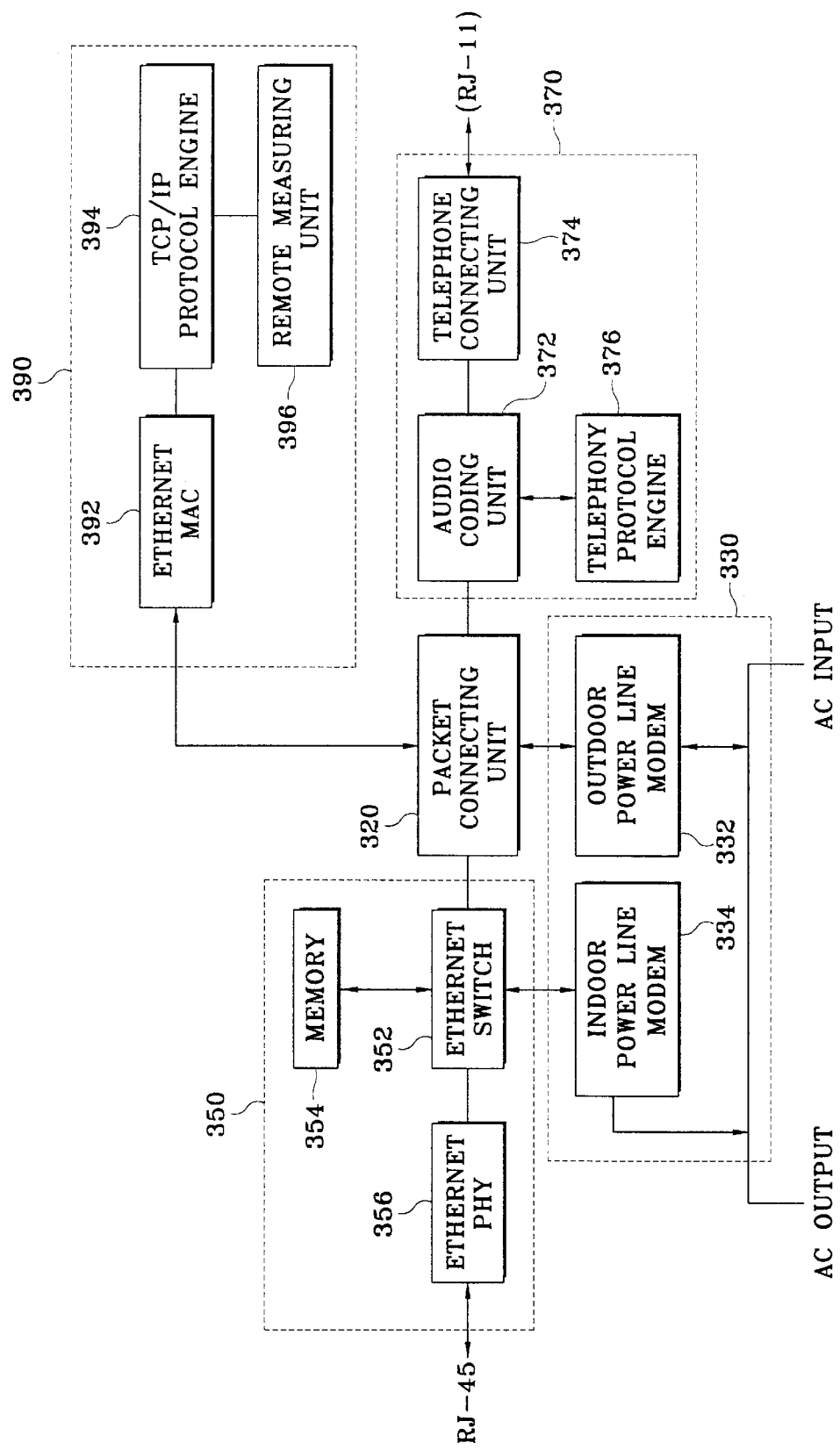
FIG. 2 is a detailed block diagram of the open type communication module shown in FIG. 1.

FIG. 2 is a detailed block diagram of the open type communication module shown in FIG. 1.

Referring to FIG. 2, the open type communication module comprises a power line communication unit 330, a packet connecting unit 320, a high speed data processing unit 350, a low speed data processing unit 390 and a telephony processing unit 370.

The power line communication unit 330 is comprised of an indoor power line modem 334 and an outdoor power line modem 332 to separate a high frequency power line communication signal from the power line signal. The indoor power line modem 334 directly performs a high speed power line data communication with the high speed data processing unit 350, and the outdoor power line modem 332 is connected to the packet connecting unit 320 to perform a communication with another outdoor power line modem (not shown) which is installed in the outdoor power line as connected to the packet connecting unit 320.

The packet connecting unit 320 communicates with each of the low speed data processing unit 390, the high speed data processing unit 350 and the telephony processing unit 270 in the form of a discriminated frame. In other words, the packet connecting unit 320 transmits the frame data to each of the corresponding processing unit including the low speed data processing unit, the high speed data processing unit and the telephony processing unit according to a fame type field value about the frame received from the outdoor power line modem 332 of the power line communication unit 330, and designates and packetizes a fame type value about the data received from each of the processing units to provide to the power line communication unit 330.

Here, the frame type is a field for discriminating that the frame received from or transmitted to the packet connecting unit 320 is one of high speed data communication, low speed data communication and telephony service.

Figures 3, 4:
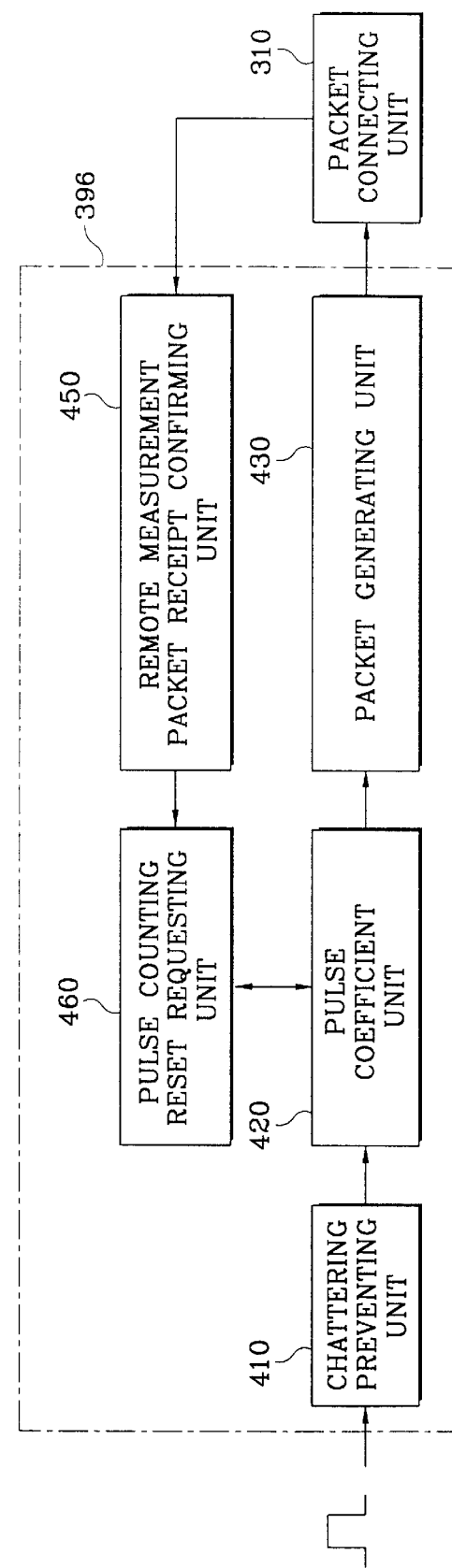
FIG. 3 shows the structure of a communication frame according to the invention.
FIG. 4 shows the structure of a remote measuring unit for an analog electricity meter according to the invention.

FIG. 3 shows the structure of a communication frame according to the invention.

Referring to FIG. 3, the communication frame comprises a preamble for informing start of frame, an SF (Start of Frame) for synchronizing the frame, a frame type for discriminating the frame according to the data processing, destination address, source address, frame length, data and an FCS (Frame Check Sequence) for confirming an error occurrence if any in receiving the frame.

Meanwhile, the high speed data processing unit 350 is comprised of an ethernet switch 352, a memory 354 and an ethernet PHY 356 by ethernet connections communicates with the power line communication unit 330 via an additional terminal for supporting the TCP/IP communication protocol, and transmits the high speed data packeted in the packet connecting unit 310 to another medium via the power line communication unit 330. Here, the additional terminal means a computer having an ethernet LAN card installed therein and a high speed data modem of an ethernet connection type. The terminal has a TCP/IP communication protocol engine within the same and can perform a high speed data transmission/receiving according to a high speed processing.

When an external computer or high speed communication unit is connected to an additional power line modem which uses the same communication mode as the indoor power line modem 334 via the power line, the data received via the indoor power line modem 334 is provided to the packet connecting unit 320 by a switching of the ethernet switch 352 to be framed thereby, and then transmitted to a higher level communication system installed outdoors via the outdoor power line modem 332.

The low speed data processing unit 390 is comprised of an ethernet MAC 392, a TCP/IP protocol engine 394 and a remote measuring unit 396, and can perform a standard protocol connection via the TCP/IP communication protocol engine. Here, the low speed data processing unit 390 has an open type protocol such as the TCP/IP, since the low speed data processing unit 390 performs a function such as the remote measuring in which the high speed communication is not required and thus a stable and easy communication connection is emphasized.

Here, the remote measuring unit 396 can be applied as two types in respect to an analog electricity meter and an electronic electricity meter. In other words, the analog remote measuring unit, which will be described in detail in reference to FIG. 4, receives and packetizes a pulse input that is generated proportionally to the consumed power quantity.

Meanwhile, the electronic remote measuring unit can transmit more power information such as valid/invalid power in addition to transmitting the measured power quantity data via a communication for example RS232 communication provided by the electronic electricity meter, and can perform a bidirectional communication.

The telephony processing unit 370 includes a telephone connecting unit 374, an audio coding unit 372 and a telephony protocol engine 376. The telephony processing unit 370 is connected to a telephone to convert an analog audio signal into a digital audio by using an audio processing unit such as a vocoder, and packetizes and transmits the digital audio to the packet connecting unit 320.

Here, the packet connecting unit 320 processes the packet from the telephony processing unit 370 prior to other packets from other units including the low speed data and high speed data processing units. In other words, when the packet from telephony processing unit 370 is received in the power line communication unit 330 or transmitted from the power line communication unit 330 to the telephony processing unit 370, the packet connecting unit 320 suspends the other types of packet services to process the packet of the telephony processing unit 370 with priority.

The foregoing processing step of the telephony packet with priority uses a time interval between the continuously transmitted packets when there are audio packet data. In other words, when transmitting a large quantity of data via the ethernet MAC 392 and the TCP/IP protocol engine 394, the low speed data processing unit 390 divides the data into packets, each having a fixed size, to send the same to the packet connecting unit 320. Here, the data is transmitted as divided according to packet as above, since efficiency according to re-transmission should be raised in the case of an error occurrence in communication.

Therefore, a certain time interval is present between each packet being continuously transmitted, and if generation of a transmitting clock provided to the ethernet switch 352 by the outdoor power line modem 334 is stopped between this interval, transmission of the next packet is stopped. Therefore, the packet connecting unit 320 controls the transmission clock provided to the ethernet switch 352 like this so that the audio data can be transmitted between continuous transmissions of the packets of the low speed data processing unit 390 and the high speed data processing unit 350. This process generally takes place when the packet connecting unit 320 processes the continuous packets requested from the high speed processing unit 350 so that the ethernet switch 352 performs a flow control in which data stored in the memory 354 connected to the ethernet switch 352 should be continuously transmitted. Therefore, upon receiving the telephony packet, the packet connecting unit 320 temporarily suspends the transmission function of the ethernet switch 352. For this, the packet connecting unit 320 temporarily suspends the transmission clock being received into the ethernet switch 352.

Generally in the case of the audio data, the packet length is not long and thus the time required for the power line communication unit 330 to process the telephony packet is relatively shorter than the data packet, so that the ethernet switch 352 even if the packet connecting unit 320 generates an interrupt to the ethernet switch 352 does not consider it as a communication stoppage.

Meanwhile, the telephony protocol engine of the telephony processing unit 370 is a separate communication frame discriminated from the standard protocol, and transmits the audio data to the higher telephony protocol engine 394 directly through an additional access point in a physical hierarchy and a data link hierarchy without passing by a TCP/IP hierarchy.

The audio coding unit 372 of the telephony processing unit 370 samples the audio signal received into the telephone connecting unit 374 with a period of 1/Ts, and digitizes the sampled audio signal by using a compression to generate a digital audio data in every Ts time. The telephony protocol engine 376 collects and packetizes n number of the digital audio data in every 1/Ts period to provide the same to the packet connecting unit 320. Here, an audio lag increases as the value of n is larger whereas communication trial is more frequent as the value of n is smaller, so that an adjustment operation is required to have a suitable value of n.

Meanwhile, the high speed data processing unit 350 and the low speed data processing unit 390 which are connected to the packet connecting unit 320 are connected with transmitting/receiving signals according to an ethernet MII (Machine Independent Interface) specification. The ethernet MII is basically comprised of transmitting/receiving data signal, transmitting clock signal and transmitting/receiving data valid signal. Input signals include receiving data, receiving data valid signal, transmitting/receiving clock, and the output signals include transmitting data and transmitting data valid signal.

FIG. 4 shows the structure of a remote measuring unit for an analog electricity meter according to the invention.

Referring to FIG. 4, the remote measuring unit 396 comprises a chattering preventing unit 410, a pulse coefficient unit 420, a packet generating unit 430, a remote measurement packet receipt confirming unit 450 and a pulse counting reset requesting unit 460.

The chattering preventing unit 410 clears a chattering from a pulse signal which is generated proportional to the consumed power quantity to provide the cleared pulse signal to the pulse coefficient unit 420. The pulse coefficient unit 420 receives the pulse signal cleared with the chattering from the chattering preventing unit 410 and provides the same to the packet generating unit 430. The packet generating unit 430 is requested with remote measurement data from the higher communication integration apparatus and applied with the pulse signal transmitted from the pulse coefficient unit 420 to form a certain size of packet and provide the same to the packet connecting unit 320.

Here, the packet connecting unit 320 provides the remote measurement information received in the form of a packet to the power line communication unit 330, and confirms receipt of the packet through the remote measurement packet receipt confirming unit 450 and provides the packet to the pulse counting reset requesting unit 460. Therefore, the pulse counting reset requesting unit 460 resets a pulse counting of the pulse coefficient unit 420 to complete one packet transmission.

FIG. 5A and FIG. 5B are communication protocol formats applied to the open type electricity meter according to the invention.

Referring to FIG. 5A, the low speed data processing unit 390, the high speed data processing unit 350 and the telephony processing unit 370 use the same physical hierarchy and data link. Therefore, a field for indicating a received frame type as shown in FIG. 3 is added to determine the corresponding processing unit, i.e., the high speed data processing unit 350, the low speed data processing unit 390 or the telephony processing unit 370 according to the field value. Also, the telephony processing unit 370 does not pass by the TCP/IP protocol from at least hierarchy 3 (network) differently from the general data so that a standard protocol is not required.

FIG. 5B shows another protocol applied to the open type electricity meter, in which a PLC PHY is divided and discriminated into PHY 1 and PHY 2 in a frequency division method. The PHY 1 and PHY 2 are allocated to exclusive frequencies in use and the PLC PHY 2 uses a CDMA (Code Division Multiple Access) system or a TDMA (Time Division Multiple Access) system so that a QoS (Quality of Service) can be ensured.

As can be seen in the foregoing description, even if the protocol discriminated into the PHY 1 and PHY 2 is more complicated compared to that of FIG. 5A, the QoS of the PLC method telephony is ensured so that the protocol can be used as the best telephone line. Therefore, the foregoing telephony is processed through a path different from the low and high speed data processing units from the physical hierarchy so that the frame is constructed and processed according to a typical independent protocol without having the field to indicate the type of the frame within the same.

As described hereinbefore, the electricity meter according to the invention comprises a TCP/IP protocol engine in which the physical hierarchy and the data link hierarchy are proposed so that the internet support together with the remote measurement via internet and the telephone and data communications are enabled and accordingly a low voltage distribution network can be applied as communication and subscriber networks to enhance the efficiency of the data communication.

While the invention has been described in reference to the preferred embodiments thereof, it should be apparent those skilled in the art that various modifications and variations of the invention can be made without departing from the spirit and scope of the invention defined in the accompanying claims.

What is claimed is:

1. An open type electricity meter installed indoors for measuring a consumed power quantity, comprising a communication protocol, and an open type communication module for performing a high speed data communication, a low speed data communication, and a telephony communication through a power line communication according to a communication frame type being transmitted and received, wherein said open type communication module further comprises:

a power line communication unit for separating a high frequency power line communication signal from a power line signal;

a packet connecting unit for transmitting the communication signal received into said power line communication unit according to frame type to a corresponding processing unit as data, and packetizes data from a higher processing unit according to frame type to provide the same to said power line communication unit;

a low speed data processing unit being connected to said packet connecting unit and installing a TCP/IP protocol engine to perform a remote measurement communication;

a high speed data processing unit for performing a communication with said power line communication unit to transmit high speed data to an indoor communication terminal and to transmit the high speed data to an outdoor communication terminal through said packet connecting unit; and a telephony processing unit connected to an external audio processing unit for coding an audio signal from the audio processing unit to be provided to said packet connecting unit and decoding the coded audio signal from said packet connecting unit to be provided to the external audio processing unit.

2. The open type electricity meter installed indoors for measuring a consumed power quantity according to claim 1, wherein said power line communication unit has:

an indoor power line modem for separating data from a power signal provided from the indoor communication terminal and performing a communication with said high speed data processing unit through the separated data; and an outdoor power line modem for transmitting the data from said packet connecting unit to the outdoor communication terminal and providing data from the outdoor communication terminal to said packet connecting unit.

3. The open type electricity meter installed indoors for measuring a consumed power quantity according to claim 1, if a packet from said telephony processing unit is received into said power line communication unit and an audio packet is transmitted from said power line communication unit to said telephony processing unit, wherein said packet connecting unit suspends other types of packet services of low and high speed and processes telephony data with priority.

4. The open type electricity meter installed indoors for measuring a consumed power quantity according to claim 1, wherein said low speed data processing unit has:

a remote measuring unit for remotely measuring the consumed power quantity; and an ethernet MAC connected to said packet connecting unit for transmitting the low speed data by the communication frame provided from the TCP/IP protocol engine and receiving the low speed data from said packet connecting unit.

5. The open type electricity meter installed indoors for measuring a consumed power quantity according to claim 1, wherein said telephony processing unit has:

a telephone connecting unit for being communication connected to an external telephone;

an audio coding unit for receiving analog audio signal of the telephone provided via said telephone connecting unit and generating digital audio data; and a telephony protocol engine for packeting the digital audio data from said audio coding unit.

6. The open type electricity meter installed indoors for measuring a consumed power quantity according to claim 1, wherein said high speed data processing unit has:

a switch connected to said packet connecting unit for performing a flow control of data according to communication;

a memory for temporarily storing the incoming packet data by the flow control of said ethernet switch; and an ethernet PHY for transmitting the continuous incoming packet data provided by the flow control of said ethernet switch to the external communication terminal.

7. The open type electricity meter installed indoors for measuring a consumed power quantity according to claim 1, wherein said additional terminals are at least one of a computer having an ethernet LAN card installed therein and a high speed data modem of an ethernet connection type which has the TCP/IP protocol engine therein and can perform a high speed data transmission and receiving according to a high speed processing.

* * * * *